United States Patent [19]

Nakanishi et al.

[11] 4,386,462
[45] Jun. 7, 1983

[54] ASSEMBLY APPARATUS HAVING OPERATING UNITS AND A POWER UNIT INTERCONNECTED BY BOWDEN CABLES

[75] Inventors: Noriaki Nakanishi, Hirakata; Tadayoshi Nishizono, Neyagawa; Masaaki Nakanishi, Hirakata; Toshiaki Nakanishi; Yoshio Kawahara, both of Neyagawa, all of Japan

[73] Assignee: Nakanishi Kikai Kabushiki Kaisha, Kadoma, Japan

[21] Appl. No.: 276,082

[22] Filed: Jun. 22, 1981

[51] Int. Cl.³ .......................................... B23P 19/00
[52] U.S. Cl. ................................................. 29/792
[58] Field of Search ............... 74/82, 55, 89.2, 108, 74/501 R, 471, 488, 487; 29/792

[56] References Cited

U.S. PATENT DOCUMENTS

| | | | |
|---|---|---|---|
| 3,057,221 | 10/1962 | Smith | 74/471 |
| 3,177,537 | 4/1965 | Raynak | 74/471 |
| 4,055,093 | 10/1977 | Ross | 74/471 |
| 4,184,236 | 1/1980 | Nutt | 29/792 |
| 4,201,095 | 5/1980 | Cirami | 74/471 |

Primary Examiner—Ervin M. Combs
Assistant Examiner—Steven E. Nichols
Attorney, Agent, or Firm—Armstrong, Nikaido, Marmelstein & Kubovcik

[57] ABSTRACT

An apparatus for an assembly line for assembling articles comprising a moving table, an operating unit disposed near the table having a member movable in two directions, at least one Bowden cable having a wire therein, one end of the wire being connected to the member, and a pulling mechanism to which the other end of the wire is connected. The return of the wire can be accomplished by a return spring on the member or by a second cable wire pulled by the pulling mechanism. Multiple units can be powered and controlled around the same table by one pulling mechanism.

1 Claim, 11 Drawing Figures

4,386,462

ASSEMBLY APPARATUS HAVING OPERATING UNITS AND A POWER UNIT INTERCONNECTED BY BOWDEN CABLES

BACKGROUND OF THE INVENTION

The present invention relates to an apparatus for simultaneously performing and powering several multiple operations in an assembly line utilizing Bowden cables.

In an apparatus used in an assembly line, e.g., an assembly line of electrical appliances, various operating units are disposed near a turntable or moving table for performing several operations to articles to be assembled on the table. Typical operations are parts feeding, checking whether the parts are fed into predetermined positions, caulking and insertion of parts with a small force, transference of articles to and from the table, and the like.

However, in a conventional apparatus used for such operations, a motor is employed to which a driving shaft is connected. The operating units are connected to the shaft through cam mechanisms which have a large and complicated structure. Therefore, such an apparatus is very expensive. Further, it is impossible to dispose the operating units remote from the shaft. It is also impossible to dispose the operating units in a position adjacent to the shaft with cam mechanisms therebetween. Therefore, it may be impossible to dispose the operating units at the most desirable positions with regard to a flow of the articles to be assembled. Moreover, since the operating units cannot be disposed in the position adjacent to each other with large cam mechanism therebetween, many (e.g., thirteen) units cannot be arranged in one apparatus. Therefore, the apparatus cannot perform many operations.

Other types of apparatuses having air cylinders for driving the operating units have been developed. In such apparatuses, the operating units can be disposed in any desired position. However, large air cylinders result in the increase of the cost of the apparatus, and large air cylinders make it impossible to arrange the many operating units in a compact apparatus.

Accordingly, it is an object of the invention to provide an improved apparatus, overcoming the above-noted disadvantages. It is another object to provide an apparatus which is simply constructed and is easily controlled and powered to enable the assembly of articles to be carried out in an efficient, compact manner.

The essence of the present invention is to provide operating units and a power-providing and controlling unit interconnected and operated by Bowden cables.

Other and further objects, features and advantages of the invention will appear more fully from the following description of the preferred embodiments of the invention.

DETAILED DESCRIPTION OF THE PREFERRED EMBODIMENTS

Figure 1:
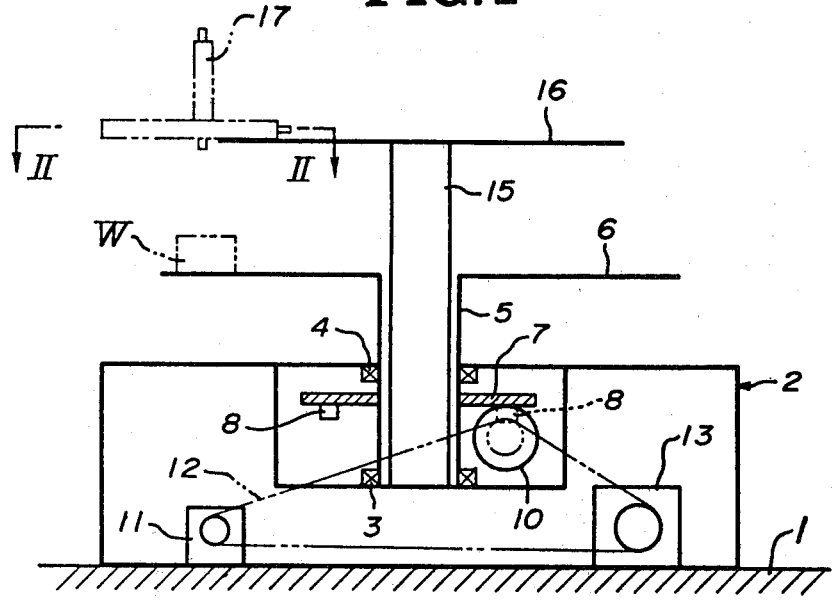
FIG. 1 is a schematic side sectional view of an apparatus according to the invention.

Referring to FIG. 1, a case 2 on a base 1 supports a lower portion of a vertical, cylindrical shaft 5 by bearings 3 and 4. Plural articles W (only one is illustrated) to be assembled are laid on a circular turntable 6 fixed at the upper end of the shaft 5. A turret 7 in the case 2 is fixed to the shaft 5. Cam followers 8 project downwardly from the turret 7 and mesh with a cam 10, which can be a roller cam, a barrel cam, a grovoidal cam or the like.

The cam 10 is connected to a motor 11 by a chain 12 so that the motor 11 turns the shaft 5 and the table 6 intermittently by the cam 10 and the cam followers 8. The chain 12 is also connected to a pulling mechanism 13, whereinafter described in detail. A column 15 fixed to the case 2 is disposed inside the shaft 5. A small circular table 16 is fixed to the upper end of the column 15, which projects upwardly from the shaft 5. Plural operating units 17 (only one is illustrated in FIG. 1) are arranged and circumferentially spaced on the peripheral portion of the table 16.

Figure 2:
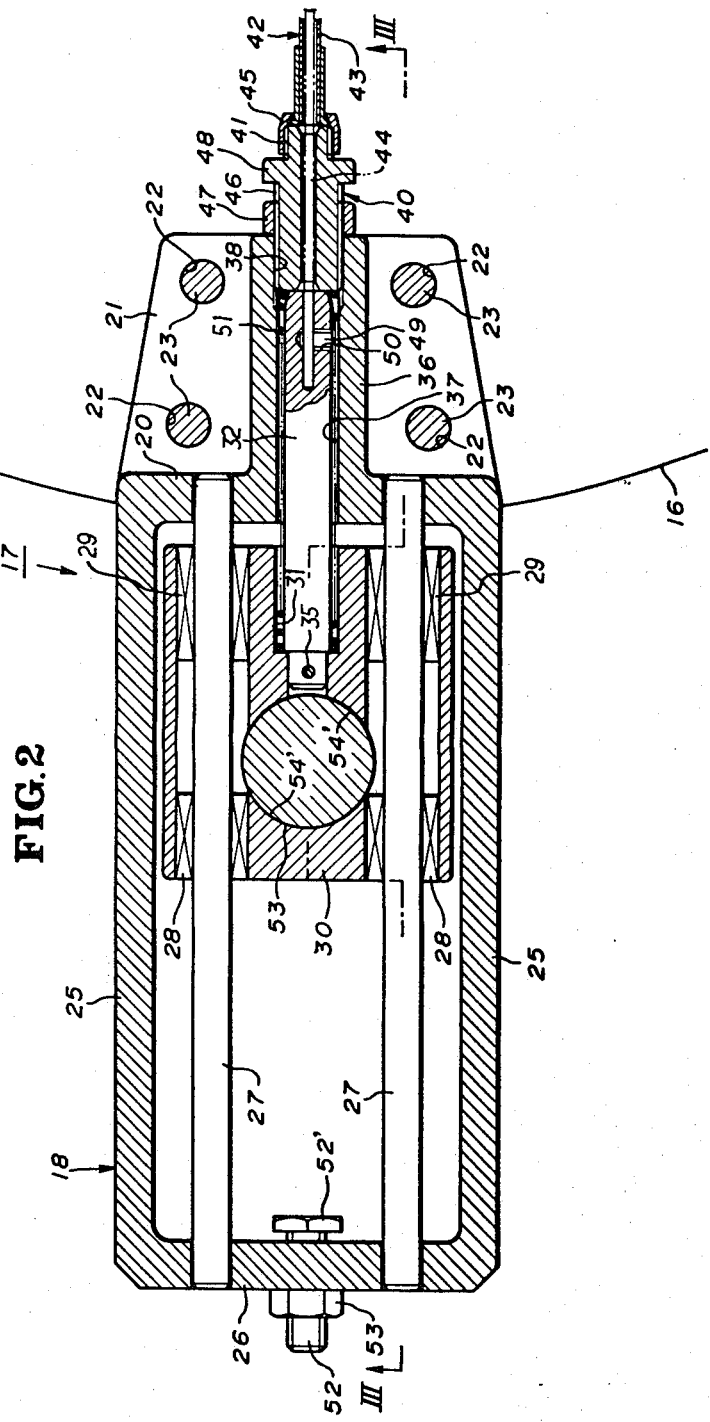
FIG. 2 is an enlarged sectional view taken alone line II—II of FIG. 1.

Referring to FIG. 2, the unit 17 has a frame 18 projecting outwardly and horizontally from the table 16. A plate-like bracket 21 extends toward the center of the table 16 from one end portion 20 of the frame 18. The bracket 21 is fixed to the table 16 by four bolts 23 inserted through holes 22. Both side portions 25 of the frame 18 extend horizontally and parallel to each other. Both end portions 20 and 26 of the frame 18 support the ends of the two guide rods 27 extending parallel to the side portion 25. Both ends of each rod 27 are fitted into holes in the end portions 20 and 26. One end of each rod 27 is fixed to the portion 26 by a set screw 24 in a screw hole 24' (see FIG. 3). A movable mounting member 30 (a movable member) is slidably fitted on the rods 27 by two sets of bushes 28 and 29. The mounting member 30 has a hole 31 between both rods 27. The hole 31 extends from the inside end (right end in FIG. 2) to the center of the mounting member 30. The hole 31 has a large diameter portion and a small diameter portion, into which an end of a rod-like stripper 32 is fitted. The stripper 32 is fixed to the mounting member 30 by a vertical set pin 35. When the mounting member 30 is shifted nearer to the end portion 20 as shown in FIG. 2, the intermediate portion and other end of the stripper 32 fit completely into a hole 37 of a cylindrical boss 36 extending from the portion 20 toward the center of the table 16. The hole 37 has screw threads 38 at its one end remote from the mounting member 30. A bolt-like stopper 40 is screwed into the screw threads 38. The stopper 40 has male screw thread portions 41 and 46 and a hexagonal flange 48 therebetween. An outer tube 43 of a Bowden cable 42 is fixed to the end of the stopper 40 remote from the stripper 32 by a clamp 45 screwed onto the screw threads 41. A locknut 47 is screwed onto the screw threads 46 and pressed to the end face of the boss 36. An inner wire 44 of the cable 42 is inserted through a hole of the stopper 40, fitted into a hole of the stripper 32, and fixed to the stripper 32 by a set screw 49 in a screw hole 50. A compressible coil spring 51 is arranged between other end face of the stopper 40 and a circular stepped face in the hole 31 of the mounting member 30. In FIG. 2, the stripper 32 is shown as being in contact with the stopper 40. A second stopper 52 formed by a bolt is screwed into a hole of the end portion 26. A lock-nut is screwed onto the stopper 52. A vertical cylinder 53 is fitted into a pair of recesses 54', each having an arcuate section, in the middle of the mounting member 30.

Figure 3:
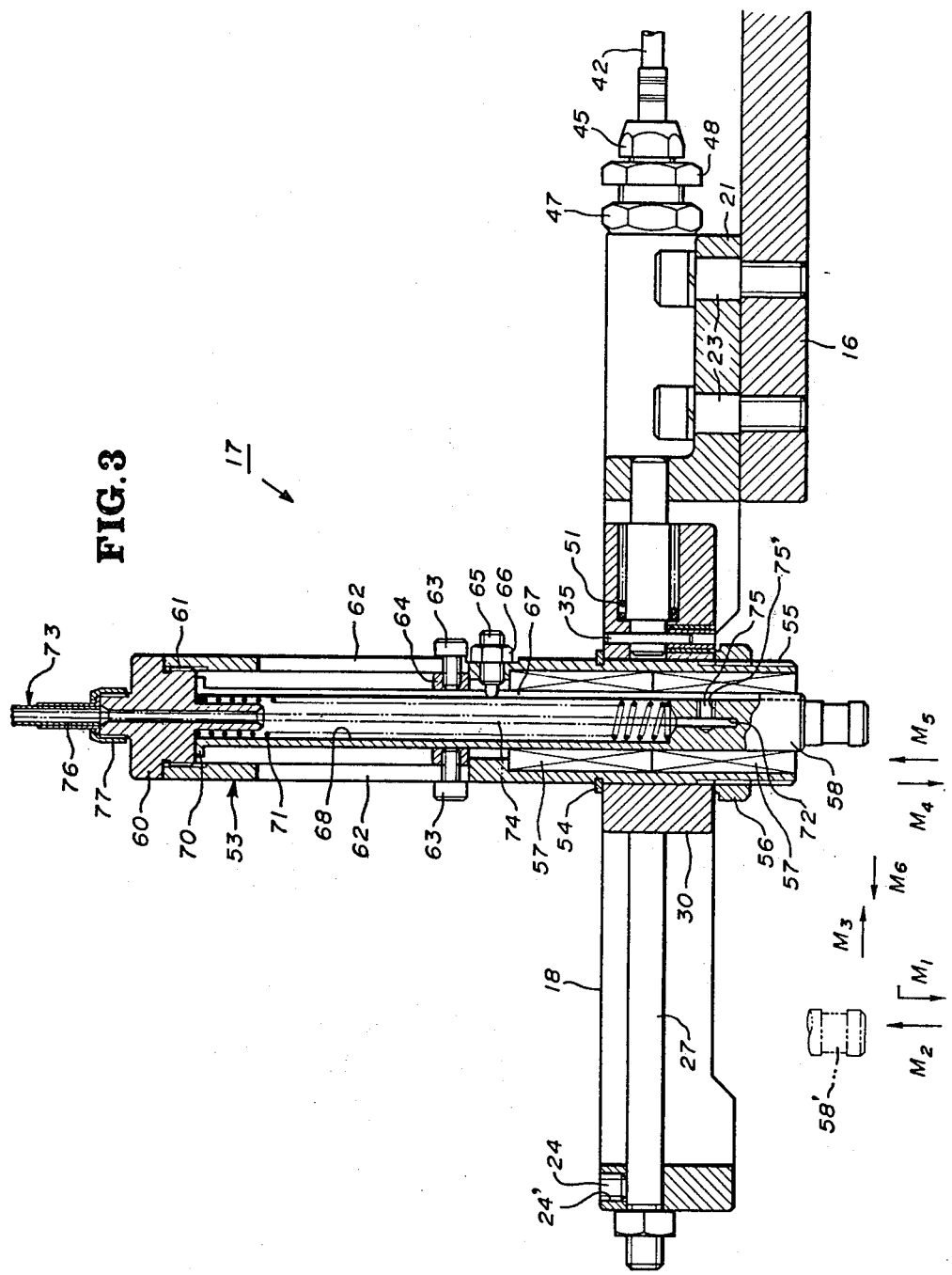
FIG. 3 is a sectional view taken along line III—III of FIG. 2.

Referring to FIG. 3, the cylinder 53 is fixed to the mounting member 30 by a snap ring 54 engaged to the cylinder 53 and by a nut 56 on screw threads 55 on the lower end of the cylinder 53. A movable vertical shaft 58 (a movable member) is slidably fitted into a bush 57 in the lower portion of the cylinder 53. A stopper 60 having screw threads 61 on its lower portion is screwed into the upper end of the cylinder 53. A pair of slits 62 extend downwardly on opposite sides from the upper portions to the middle portion of the cylinder 53. A horizontal screw 63 passes through each slit 62, and is screwed into a cylindrical stopper 64. The stopper 64 is fixed to the cylinder 63 by the screws 63. A screw 65 is screwed into a hole in the cylinder 53 and fits into a vertical groove 67 on the surface of the shaft 58. The shaft 58 is prevented from rotation by the screw 65. A locknut 66 is fitted on the screw 65. The shaft 58 is provided with a vertical bore 68 extending from the upper end of the shaft to a point near the lower end of the shaft. The shaft 58 is provided with a radial flange 70 at its upper end. A compressible coil spring 71 is arranged between the bottom of the bore 68 and the stopper 60. The bore 68 is provided with a small hole 72 at the bottom, into which an end of an inner wire 74 of a Bowden cable 73 is fitted and fixed by a set screw 75 in the hole 75'. The wire 74 passes through a hole in the stopper 60. An outer tube 76 of the cable 73 is fixed to the stopper 60 by a clamp 77 screwed onto a male screw thread portion of the stopper 60. Although it is not illustrated in the Figures, an air-chuck, magnet-chuck or the like is fixed to the lower end of the shaft 58. A chuck 17c, hereinafter described in detail with reference to FIG. 8, may be fixed to the lower end of the shaft 58.

Figure 4:
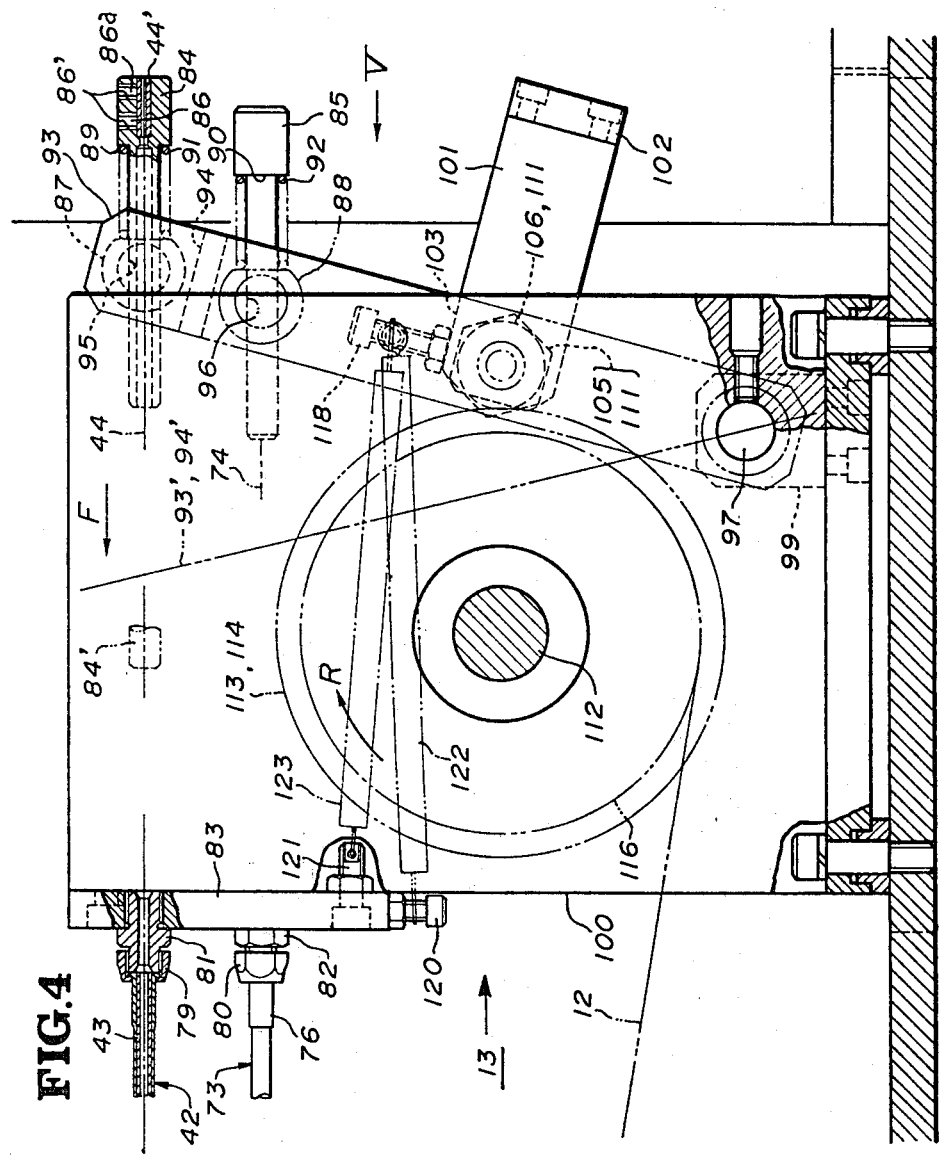
FIG. 4 is an enlarged, partially cut-away view of a pulling mechanism in FIG. 1.

Referring to FIG. 4, the other ends of the outer tubes 43 and 76 are respectively fixed by nut-like clamps 79 and 80 to holders 81 and 82 having male screw threads, which are screwed into screw holes of vertical plate 83 with a vertical space therebetween. Both inner wires 44 and 74 pass through holes in the holders 81 and 82, and are fitted into slitted sleeves 44' in holes in cylindrical holders 84,85 arranged substantially in line with the holders 81 and 82, respectively. The inner wires 44 and 74 are fixed to the holders 84 and 85 by the sleeves 44' and screws 86 in the holes 86' of the holders 84 and 85. The holders 84 and 85 are slidably fitted into holes extending diametrically in horizontal rods 87 and 88 respectively. Compressible coil springs 91 and 92 are arranged between the rods 87 and 88 and stepped portions 89 and 90 on the outer peripheries of the holders 84 and 85, respectively.

Figure 5:
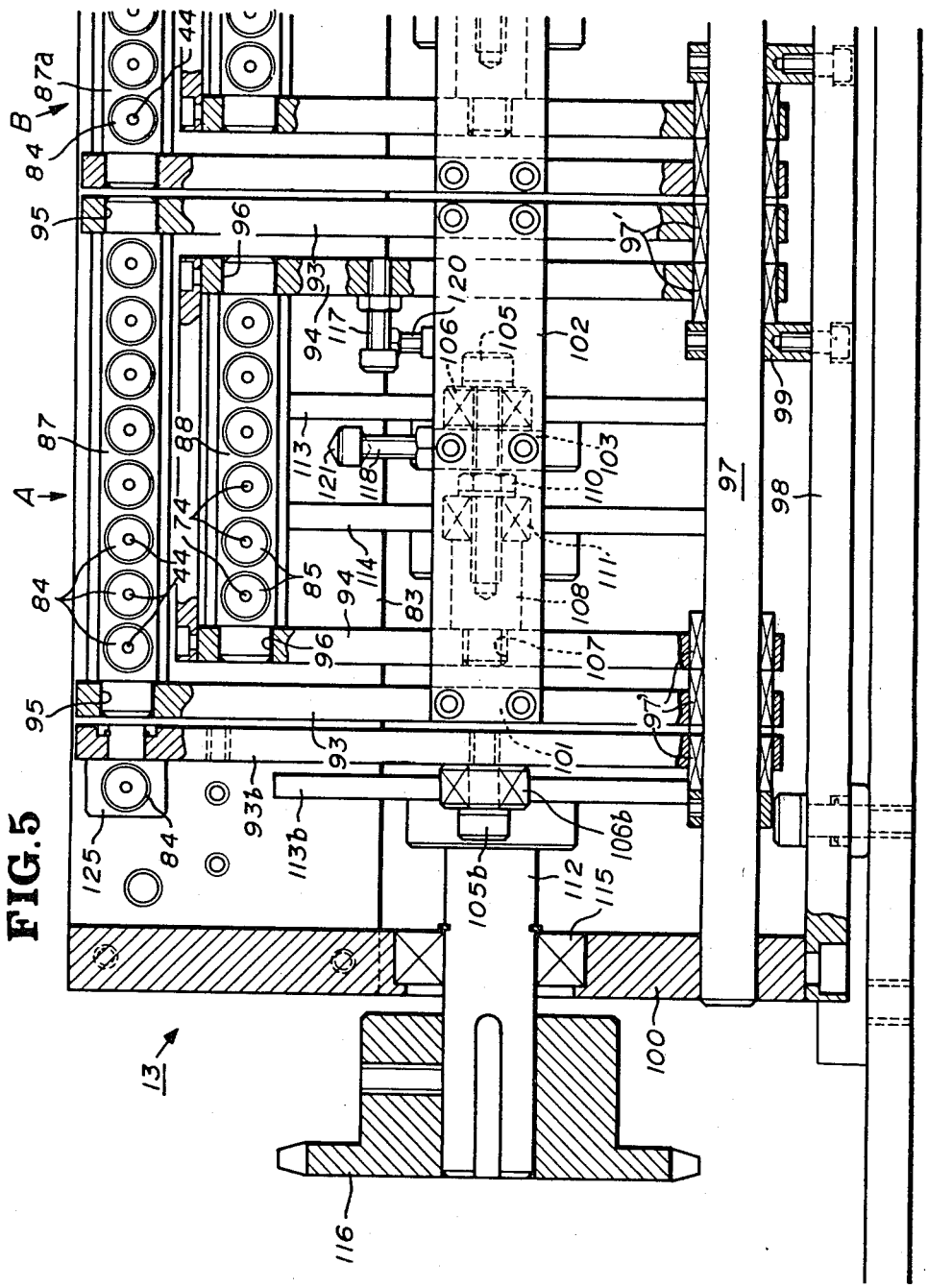
FIG. 5 is an elevational view of the pulling mechanism taken in the direction of the arrow V in FIG. 4.

Referring to FIG. 5, eight holders 84 are arranged on the rod 87. Six holders are arranged on the rod 88. One of the eight holders 84 is connected to the mounting member 30 in FIG. 3 by the wire 44. Another seven holders 84 are respectively connected by the wires 44 to movable members such as other mounting members of other operating units, which operate substantially synchronously with the mounting member 30. Seven or less holders 84 may be arranged on the rod 87. More than eight holders 84 may be arranged on the rod 87 and a rod 87a which are synchronized with each other, so that more than eight working units may be synchronized. One of the six holders 85 on the rod 88 is connected to the shaft 58 in FIG. 3 by the wire 74. Another five holders 85 are respectively connected by the wires 74 to movable members, such as other vertical shafts, of other operating units which operate substantially synchronously with the shaft 58.

Each of the rods 87 and 88 is supported rotatably at both ends in holes 95 and 96 in each pair of arms 93 and 94. Each of the arms 93 and 94 extends downwardly from the hole 95 or 96 and is supported at the lower end by a bush 97' on a common shaft 97 extending parallel to the rods 87 and 88. The shaft 97 is fixed to side frames 100 (only one is illustrated) and brackets 99 bolted to the bottom frame 98. Brackets 101 extend from the middle portions of the arms 93 in a direction opposite to the plate 83 in FIG. 4. Both ends of a cross member 102 are bolted to the ends of the brackets 101. An end of a bracket 103, which is parallel to the bracket 101, is bolted to the middle of the member 102. As shown in FIG. 4, a circular cam follower 106 is connected by a bolt 105 to a side face of the other end of the bracket 103 which is positioned between a pair of the arms 93. In FIG. 5, the left arm 94 of the two arms 94 is provided at middle with a screw hole 107 which is parallel to the rod 88. A screw of a bracket 108 is screwed into the hole 107 from the right in FIG. 5. A circular cam-follower 111 is connected to the end face of the bracket 108 by a bolt 110. Both cam-followers 106 and 111 are, respectively, in contact with plate cams 113 and 114 fixed on a common drive shaft 112 which is supported parallel to the shaft 97 by bearings 115 (only one is illustrated) in the side frame 100. A sprocket 116, which the chain 12 in FIG. 1 is retained around, is fixed to an end of the shaft 112. A horizontal bolt 117 is screwed into a screw hole formed at the middle of other (right) arm 94. A vertical bolt 118 is screwed into a screw hole formed at the top face of the bracket 103. As shown in FIG. 4, extensible coil springs 122 and 123 (return springs) are arranged between said bolts 117 and 118 and bolts 120 and 121 are fixed to the plate 83, respectively.

As shown in FIG. 5, one arm 93b is arranged between the frame 100 and the left arm 93. The arm 93b is adjacent to the arm 93 and supports a rod 125 projecting toward the plate 100. The rod 125 supports the other wire holder 84. A driving unit A consists of said members in FIGS. 4 and 5, and a similar driving unit B is arranged beside the unit A. The common shaft 97 and the driving shaft 112 is used in both units A and B.

In the operation, when the tension of the wire 44 in FIG. 2 is reduced, as hereinafter described in detail, the spring 51 pushes the mounting member 30 on the guide rods 27 and brings it into contact with the stopper 52. In this position, the shaft 58 in FIG. 3 occupies a position indicated by number 58'. The above position of the mounting member 30 can be shifted by turning the stopper 52 and thereby shifting the head 52' of the stopper 52. Then the wire 44 is pulled by the pulling mechanism 13 in FIG. 4, so that the mounting member 30 is pulled back by the stripper 32 and the wire 44, while compressing the spring 51 and the stripper 32 comes in contact with the stopper 40, as shown in FIG. 2. The above returned position of the mounting member 30 can be shifted by turning the stopper 40 and thereby changing the fitting length of the stopper 40 in the hole 37.

In FIG. 3, when the tension of the wire 74 is reduced, the spring 71 pushes the shaft 58 down to the lowermost position, and the flange 70 comes in contact with the stopper 64. The lowermost position can be shifted by resetting the position of the stopper 64 by the screw 63. Then the wire 74 is pulled by the pulling mechanism 13 in FIG. 4 so that the shaft 58 returns to the uppermost position, and the flange 70 comes in contact with the stopper 60 as shown in FIG. 3. The uppermost position can be shifted by turning the stopper 60 and thereby changing the fitting length of the stopper 60 in the cylinder 53. Other operating units (not illustrated) are similarly driven by other wires and springs.

One of the specific functions or operations of the unit 17 can be as follows. In FIG. 3, the shaft 58 lowers in the direction of arrow $M_1$ from the mounting member 30 near the end portion 26 (FIG. 2). In the lowered position, an air driven chuck or the like supported by the lower end of the shaft 58 holds a part for assembling. The shaft 58 then rises as shown by arrow M2. Further, the mounting member 30 moves inwardly as shown by arrow M3. Then the shaft 58 lowers as shown by arrow M4 and the chuck feeds a part to the article W being assembled in FIG. 1. After feeding, the shaft 58 rises as shown by arrow M5, and the mounting member 30 returns outwardly as shown by arrow M6. After this cycle of operation, similar operations are repeated. If there is no trouble in the holding and feeding operation of the parts to be added to the articles W, the shaft 58 and the mounting member 30 may be operated simultaneously. The table 6 in FIG. 1 turns intermittently in synchronized relation to the described operation cycle, so that an unprocessed article W stops under the unit 17 and the processed article W moves to an adjacent processing stage of another operating unit, e.g., under another operating unit, after one operation cycle.

The operation of the wire pulling mechanism 13 is as follows. In the position shown in FIG. 4, the arms 93 have pulled the wire 44 to the most distant position from the plate 83. When the cam 113 turns in the direction of arrow R from the position shown in FIG. 4, the arms 93 are pulled by the spring and swing in the direction of arrow F around the shaft 97 to the position indicated by the number 93'. By this swing, the tension applied to the wire 44 from the arms 93 through the rod 87, spring 91 and the holder 84 is reduced. By this reduction, the mounting member 30 in FIG. 2 moves outwardly as described before, and pulls the wire 44 in the direction F in FIG. 4 so that the holder 84 moves to the position near the plate 83 as illustrated by 84'. When the tension of the wire 44 is reduced, the wire 44 tends to slack between both holders 81 and 84'. However, since both ends of the wire 44 are pulled in the opposite directions by the springs 51 (FIG. 2) and 91 (FIG. 4), there is no chance that the wire 44 may slack. When the cam 113 turns further, the arms 93 swing in the direction opposite to the arrow F and return to the position illustrated in solid lines in FIG. 4. By this return, the wire 44 is pulled and the mounting member 30 in FIG. 2 returns to the position illustrated in FIG. 2.

The timing in operation between the arms 93 and the mounting member 30 can be adjusted by changing the characteristics of the springs 51 and 91. When a spring, which is long in free condition and is strongly compressed in use, is employed as the spring 91, the elastic force of the spring exceeds the elastic force of the spring 51 in FIG. 2, and until the arms 93 swing to some extent from the position shown in solid line in FIG. 4. Therefore, the mounting member 30 starts to move after the arms 93 swing to some extent. In contrast thereto, when a spring which is weak, and the elastic force thereof is the same as that of the spring 51 in the condition shown in FIG. 4, is employed as the spring 91, the mounting member 30 starts to move at the same time as the arms 93 start to swing. When the elastic force of the spring 51 exceeds that of the spring 91, the mounting member 30 is held in contact with stopper 52 and does not move until the arms 93 swing to some extend from the position shown by the numeral 93' in FIG. 4. In contrast thereto, when both elastic forces of the springs 51 and 91 in the above forward position are equal, the mounting member 30 starts to move at the same time as the arms 93 start to swing from the position shown by the number 93'. The timing in operation between the arms 93 and the other units connected to the rod 87 in FIG. 5 through the holders 84 and the wires 44 are similarly adjusted to the desired timings by the springs associated thereto.

The arms 94 are driven to swing by the cam 114. Slacking of the wire 74 is prevented by the spring 71 in FIG. 3 and the spring 92 in FIG. 4. The timing in operation between the shaft 58 and the arms 94 is adjusted to a desired timing by selecting the characteristics of the springs 71 and 92. The timings of other units connected to the rod 88 in FIG. 5 are also adjusted. The arm 93b and the unit B operate similarly.

As stated hereinbefore, since the working unit 17 is driven by the Bowden cables 42 and 73, the structure of the unit 17 is simpler than those of the conventional types which are driven directly by a cam mechanism or an air cylinder. Since each unit 17 is small, many (e.g., thirteen) units can be set in one apparatus, whereby working ability (number of the working steps) of the apparatus is increased. The position at which each unit 17 can be set is free, whereby each unit 17 can be set at the most desirable position, taking the flow of assembly of the article W into consideration.

Since many cables connected to the units which operate in substantially synchronized relation are pulled by one or a few rods 87 and 88, the structure of the pulling mechanism 13 is simple. This reduces the cost of the apparatus.

By selecting the characteristics of the springs (e.g., 51 and 91) at both ends of the cable, the timing in operation of each unit can be adjusted. Accordingly, each unit can operate in the most desirable timing, although many cables of many units are pulled by one or few rods 87 and 88.

In a modification of the present invention, the cable 42 and the movable mounting member 30 in FIG. 2 may be eliminated. The structure, such as the shaft 58 in FIG. 3 which is movable in vertical direction, may be solely employed. The cable 73 and the cylinder 53 may be eliminated. Thus structure such as the shaft 58 may be movable in only a horizontal direction and may be solely employed. Units in FIGS. 6–10 may be employed.

Figure 6:
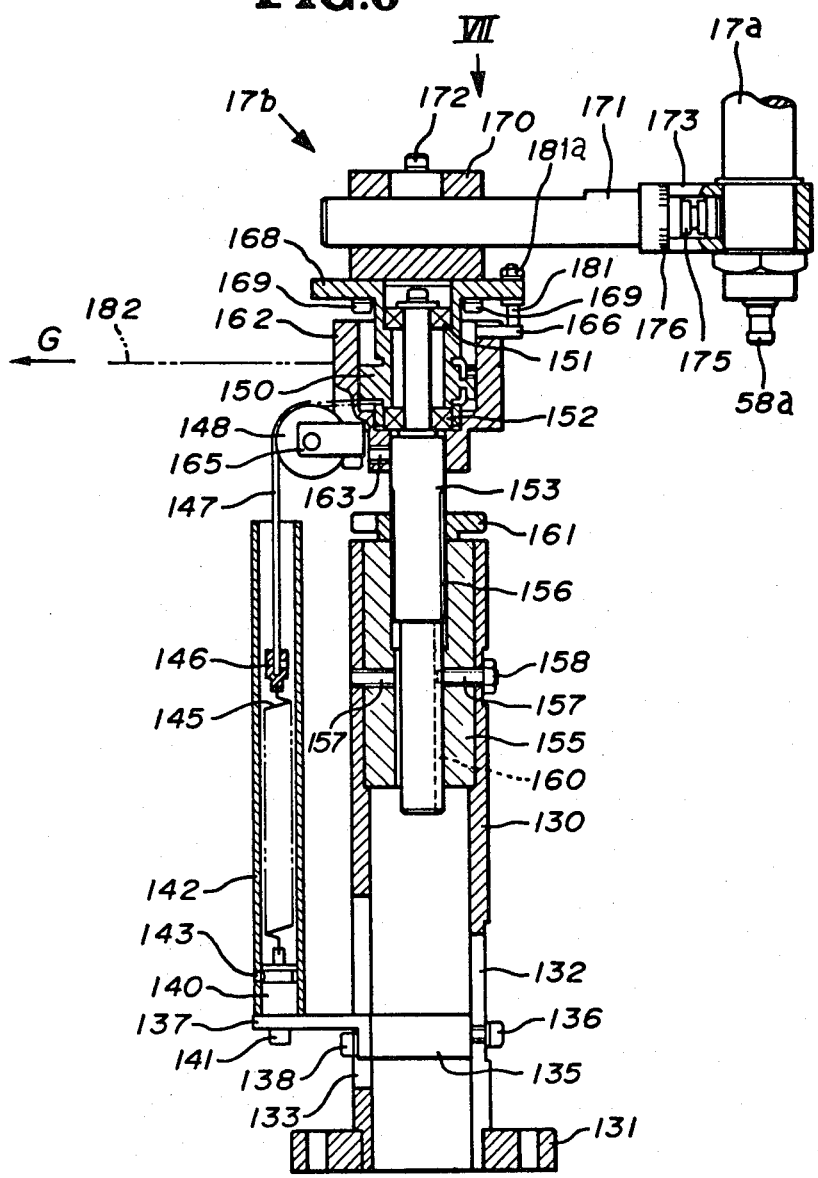
FIGS. 6 and 8 are vertical sectional views of working units of other embodiments of the invention, respectively.

Referring to FIG. 6, a vertical cylindrical member 130 is provided at the lower end with a radial flange 131 which is fixed to the table 16 in FIG. 1. Two slits 132 and 133 extend between the lower end and the middle of the member 130. A circular plate 135 is fitted in the member 130 and is fixed to the member 130 by a bolt 136 inserted into the slit 132 from the the outside of the member 130. A horizontal bracket 137 is fixed to the plate 135 by a bolt 138 and extends outwardly through the slit 133. A vertical spring holder 140 is fixed on the outer end of the bracket 137 by a bolt 141. A lower end of a vertical, cylindrical spring guide 142 is fitted to outside of the holder 140 and is fixed thereto by a set screw 143. A lower end of an extensible coil spring 145 (return spring) is hooked to the holder 140. The upper end of the spring 145 is hooked to a holder 146 which is fixed to an end of a wire 147 by a screw. The wire 147 extends upwardly from the holder 146, turns horizontally around a roller 148 and is fixed to a cylindrical outer surface of a vertical drum 150. Upper and lower ends of the drum 150 are supported by bearings 151 and 152 on a vertical shaft 153. The shaft 153 projects downwardly from the drum 150. The lower portion of the shaft 153 is provided with male screw threads and is screwed into a cylindrical member 155. The member 155 is fixed to the member 130 by set screws 157 and lock nuts 158. The end of each screw 157 is fitted into a vertical groove 160 formed at the shaft 153 and thereby prevents the shaft 153 from turning. A lock nut 161 is screwed to the upper end of the male screw threads 156. A cover 162 is arranged under and around the drum 150. The lower end of the cover 162 is fixed to the shaft 153 by a set screw 163. A bracket 165 is fixed to the lower portion of the cover 162 and rotatably carries roller 148. A horizontal stopper pin 166 is fixed to the upper end of the cover 162, and projects outwardly from the cover 162. The drum 150 is provided at its upper end with a radial flange 168, on which a holder 170 is fixed by bolts 169. An end of an arm 171 is fixed to the holder 170 by bolts 172. Another type of operating unit 17a is supported by a holder 173 on the other end of the arm 171. A vertical shaft 58a is vertically movable and supports an air chuck (not shown) or the like at its lower end. The holder 173 is supported by a screw mechanism 175 on the arm 171 and is inclinable around the lengthwise center of the arm 171 so that the holder 173 and the unit 17a may occupy any desirable inclined position. The mechanism 175 is provided with a scale 176 for indicating an inclined degree.

Figure 7:
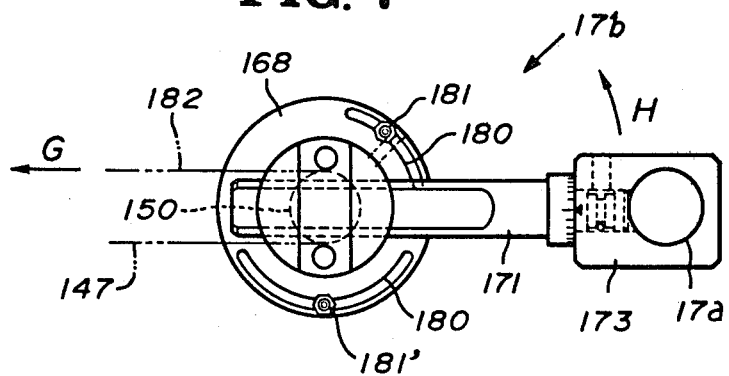
FIG. 7 is a plan view of the working unit taken in the direction of the arrow VII in FIG. 6.

Referring to FIG. 7, the flange 168 is provided with two arcuate slits 180 into which vertical pins 181 and 181' are inserted, respectively. As shown in FIG. 6, the pin 181 extends downwardly to the same level as the pin 166. The pin 181 is fixed to the flange by a nut 181a on the top thereof and by a radial flange at the middle thereof. As shown in FIG. 7, a wire 182, which is an inner wire of a Bowden cable, is retained around and fixed to the drum 150 in the opposite direction in which the wire 147 is retained around the drum. An outer tube (not shown) of the wire 182 is fixed to the cover in FIG. 6. The other end, which is not illustrated, of the wire 182 is connected to the pulling mechanism 13 in FIGS. 4 and 5.

In a unit 17b illustrated in FIGS. 6 and 7 and described hereinbefore, when the wire 182 is pulled in a direction shown by arrow G, the drum 150 turns and the arm 171, as well as the unit 17a, swing as shown by arrow H (See FIG. 7). When the tension of wire 182 is reduced, the drum 150 is turned by the elastic force of the spring 145 in FIG. 6 transmitted through the wire 147. The arm 171 and the unit 17a swing in the contrary direction to the arrow H. In the above swing operation, a limit of the swing contrary to the arrow H is determined by the contact of the pin 181 with the pin 166. The limit of the swing along the arrow H is determined by the contact of the pin 181' with a pin (not shown) on the cover 162.

Figure 8:
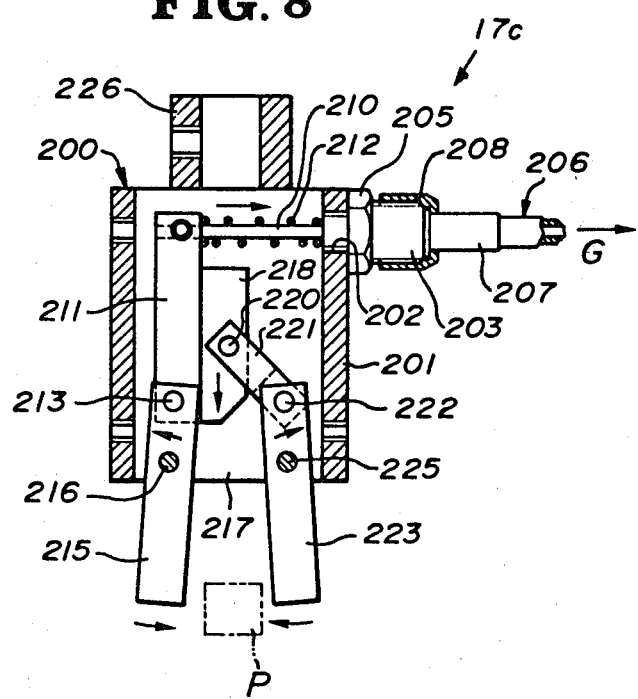

Referring to FIG. 8, a chuck 17c can comprise a vertical cylindrical frame 200 having an oblong section. An endwall 201 of the frame 200 is provided at the upper portion with a screw hole 202 into which a holder 203 is screwed and fixed by a nut 205. An outer tube 207 of a Bowden cable 206 is fixed to the holder 203 by a clamp 208. An end of the inner wire 210 extends into the frame 200 through a hole in the holder 203, and is fixed to an upper end of a vertical lever 211. A compressible coil spring 212 is arranged around the wire 210 and between the end wall 201 and the lever 211. The lower portion of the lever 211 is connected to an upper portion of a lever 215 by a horizontal pin 213 arranged perpendicular to the wire 210. The intermediate portion of the lever 215 is supported by both side walls 217 of the frame 200 through a pin 216 parallel to the pin 213. The lever 211 is provided with a vertical plate portion 218 projecting toward the end wall 201. The portion 218 supports an upper portion of a lever 221 by a pin 220 parallel to the pin 216. The lower end of the lever 221 supports an upper end of a lever 223 by a pin 222 parallel to the pin 216. The intermediate portion of the lever 223 is supported by the side walls 217 through a pin 225 parallel to the pin 216. The pin 220 is higher and between the pins 213 and 222. The frame 200 is provided at its upper end with a connecting portion 226 for connecting to another operating unit.

In the operation, when the wire 210 is pulled in the direction of arrow G, the lever 211 moves in the same direction. The distance between the pins 220 and 225 is reduced. The pin 220 moves downwardly. By that downward movement, the pin 222 moves toward the end wall 201, and the pin 213 moves oppositely towards the wall 201. Accordingly, the lower ends of the levers 215 and 223 move toward each other and can pinch a part P. When the tension of the wire 210 is reduced, the levers and other members return to the position illustrated in FIG. 8 by the elastic force of the spring 212, and the levers 215 and 223 release the part P.

Figure 9:
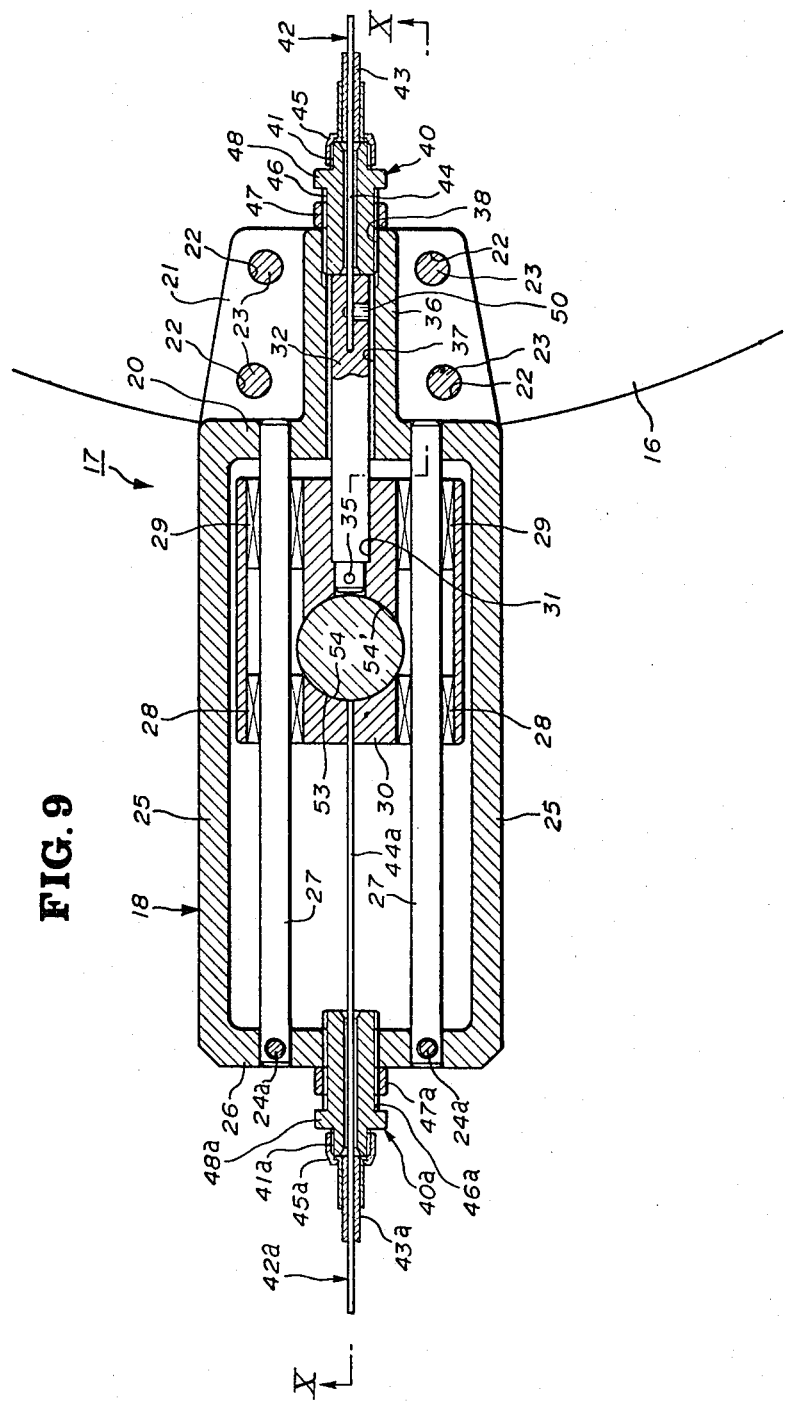
FIG. 9 is a vertical sectional view of a working unit of still another embodiment.
Figure 10:
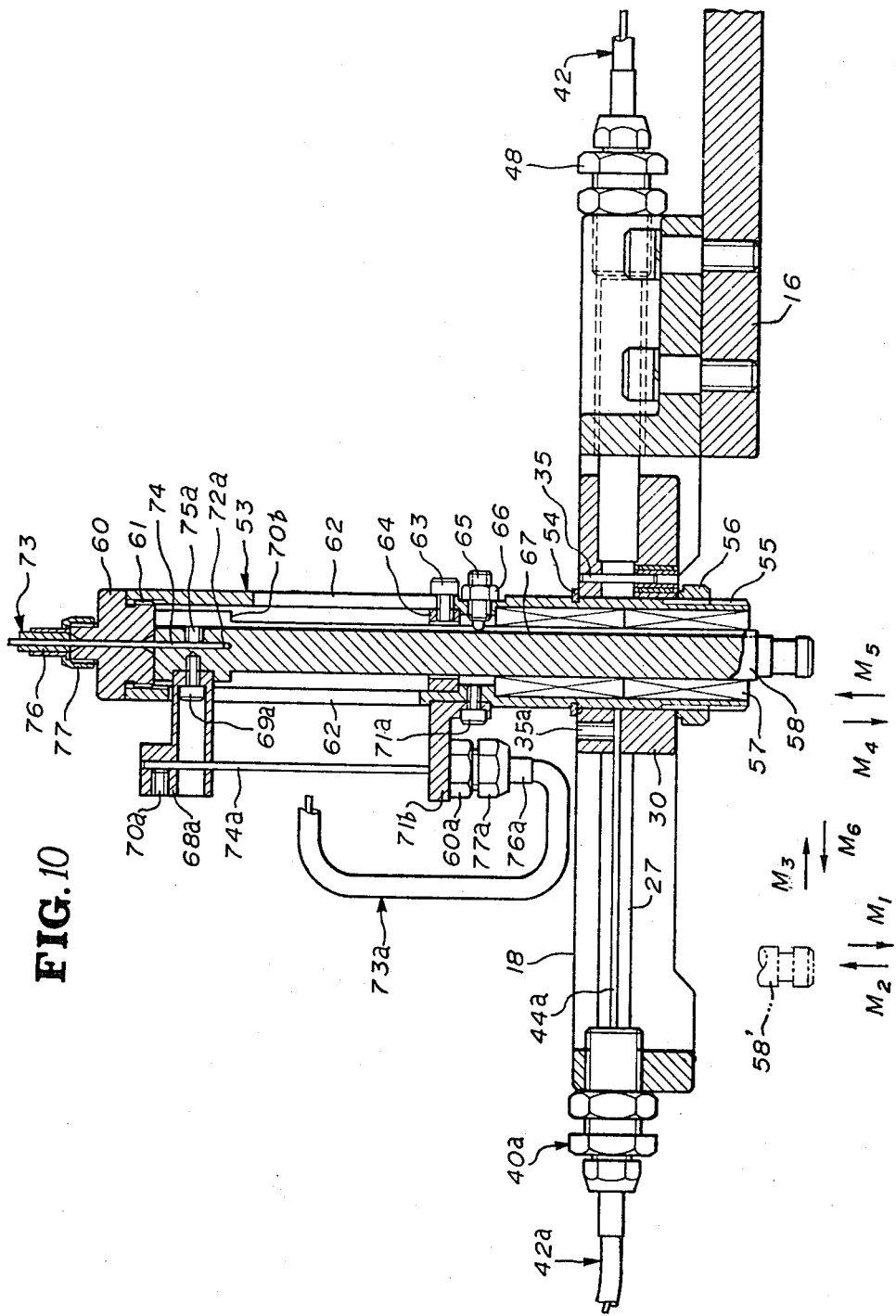
FIG. 10 is a sectional view taken along line X—X in FIG. 9.
Figure 11:
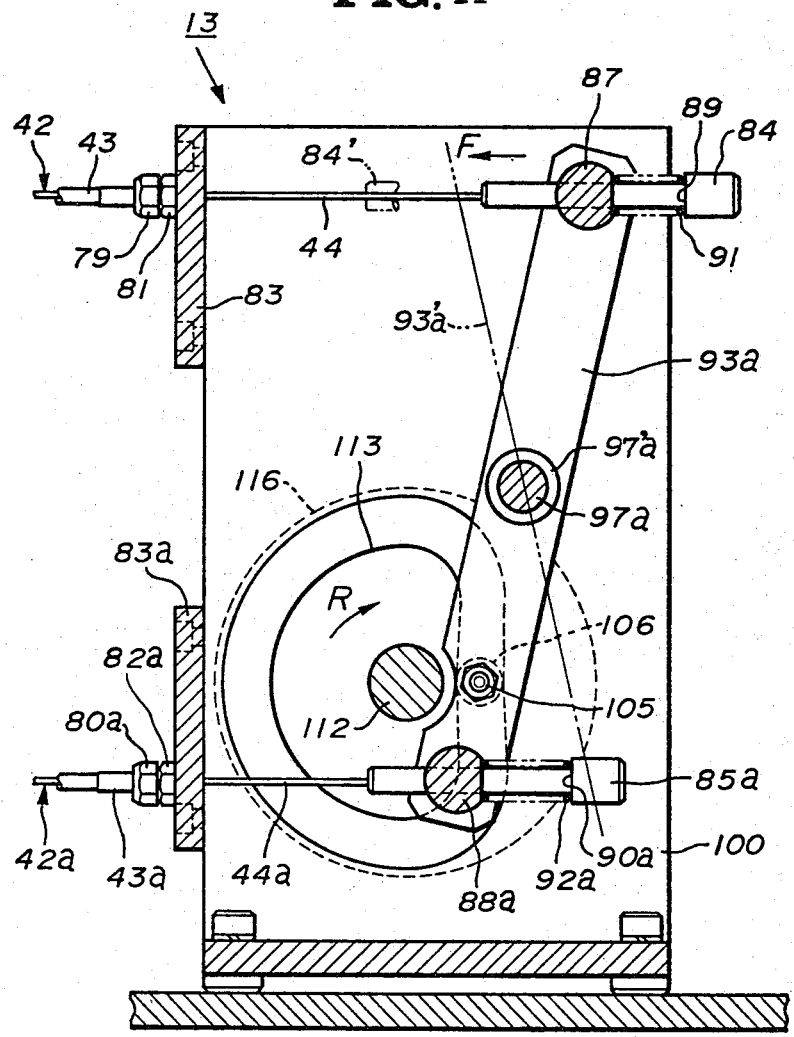
FIG. 11 is a vertical sectional view of a pulling mechanism used for the units in FIGS. 10 and 11.

Referring to FIGS. 9-11, the structures shown are similar in some mechanisms to those in FIGS. 2-4, and thus the same members bear the same reference numbers. The following mechanisms are different:

A unit 17 in FIG. 9 does not employ the spring 51 of FIG. 2 and, instead, is provided with a second stopper 40a screwed into a hole in the end portion 26. The second stopper 40a is similar to the stopper 40, and is provided at the end outside the frame 18 with male screw threads 41a to which a clamp 45a for fixing an outer tube 43a of a Bowden cable 42a is screwed. The second stopper 40a is provided with screw threads 46a to which a lock nut 47a is screwed, and with a hexagonal flange 48a. An inner wire 44a of the cable 42a passes through a hole in the second stopper 40a, is fitted into a hole of the mounting member 30 and is fixed by a set screw 35a in FIG. 10. The cable 42 forms a first cable with respect to the mounting member 30, and the cable 42a forms a second cable.

Referring to FIG. 10, the shaft 58 is provided with a small vertical hole 72a at the upper end, in which an inner wire 74 of the Bowden cable 73 is fitted and fixed by a set screw 75a.

A horizontal bracket 68a projecting out through the slit 62 is fixed to the upper end of the shaft 58 by a bolt 69a. An inner wire 74a of a Bowden cable 73a is fixed to the outer end of the bracket 68a by a set screw 70a. A horizontal bracket 71b is arranged under the bracket 68a, and is fixed to the intermediate portion of the cylinder 53 by a bolt 71a. A holder 60a similar to the holder 60 is screwed from below into a screw hole in the bracket 71b. A clamp 77a for fixing an outer tube 76a of the cable 73a is fixed to the lower end of the holder 60a. The cable 73 forms a first cable with respect to the shaft 58, and the cable 73a forms a second cable.

Referring to FIG. 11, the other ends of the outer tubes 43 and 43a are fixed to holders 81 and 82a by nut-like clamps 79 and 80a, respectively. The holders 81 and 82a are fixed to the plates 83 and 83a fixed to the upper portion and lower portion of the side frame 100, respectively. Both inner wires 44, 44a pass through the holes in the holders 81 and 82a, and are fixed to the holders 84 and 85a, respectively. The holders 84 and 85a are fitted slidably into the holes in horizontal rods 87 and 88a perpendicular to the holders 84 and 85a, respectively. Compressible coil springs 91 and 92a are arranged between stepped portions 89 and 90a of the holders 84 and 85a and the rods 87 and 88a, respectively.

Although not illustrated, each of the rods 87 and 88a supports plural spaced holders to which wires respectively connected to the units are fixed. The other ends of the inner cables 74 and 74a shown in FIG. 10 are similarly connected to the holders on the rods 87 and 88a or on another rod.

Both ends of the rod 87 are supported by the upper ends of a pair of arms 93a, only one of which is illustrated. Both ends of the rods 88a are supported by the lower ends of the arms 93a. Each arm 93a is supported at the intermediate portion by a common shaft 97a parallel to the rods 87 and 88a with a bush 97'a therebetween. Both ends of the shaft 97a are supported by a pair of vertical frames 100. A circular cam follower 106 is fixed to one of the arms 93a by a bolt 105 parallel to the shaft 97a. The cam follower 106 is arranged between the shaft 97a and the rod 88a, and is in contact with a cam 113 on a drive shaft 112. A return spring (not shown) is arranged between the arm 93a and the plate 83 or another member for bringing and holding the cam follower 106 in contact with the cam 113.

In operation, when the tension of the wire 44 is reduced as hereinafter described in detail and the wire 44a is pulled, the mounting member 30 in FIG. 9 moves on the rods 27 and comes in contact with the stopper 40a. When the tension of the wire 44a is reduced, and the wire 44 is pulled, the mounting member 30 is pulled by the stripper 32 and returns to the position in which the stripper is in contact with the stopper 40.

In FIG. 10, when the tension of the wire 74 is reduced and the wire 74a is pulled, the shaft 58 is lowered to the position in which a stepped portion 70b at the upper portion of the shaft 58 is in contact with the stopper 64. When the tension of the wire 74a is reduced and the wire 74 is pulled, the shaft 58 returns to the position in which the upper end of the shaft 58 is in contact with the stopper 60. The specific function of the unit 17 in FIGS. 9 and 10 is similar to that of wall 17 in FIGS. 2 and 3.

In the position shown in FIG. 11, the arms 93a have pulled the wire 44 to the most distant position from the plate 83. When the cam 113 turns in a direction of arrow R from the position shown in FIG. 11, the arms 93a are pulled by the return spring (not shown) and swing in the direction of arrow F around the shaft 97a to the position indicated by the number 93'a. By this swing, the tension applied to the wire 44 is reduced, and the wire 44a is pulled. By this operation, the mounting member 30 moves outwardly as described before. When the cam 113 rotates further, the arms 93a swing in the opposite direction and the mounting member 30 returns to the position illustrated in FIGS. 9 and 10. The timing in operation between the mounting member 30 and the arms 93a can be adjusted by selecting the characteristics of the springs 91 and 92a.

One or a few solenoids or air cylinders may be employed for pulling a group of the wires instead of the cam mechanisms in FIGS. 4 and 11. The present invention may be applied to an apparatus wherein a table for supporting articles to be assembled or worked on intermittently moves straightly, or an apparatus wherein the table moves or turns without a stop. The unit 17 in FIG. 1 may be arranged in a position apart from the table 16 by a suitable frame.

Although the invention has been described in its preferred form with a certain degree of particularity, it is understood that the present disclosure of the preferred form may been changed in the details of construction and the combination and arrangement of parts may be resorted to without departing from the spirit and scope of the invention as hereinafter claimed.

What is claimed is:
1. An assembly apparatus comprising:
a rotatable turntable;
means for rotating said turntable;
a fixed table positioned above said turntable and having an outer periphery;
a plurality of operating units mounted on said fixed table and extending outwardly and horizontally from said outer periphery, each operating unit having a member moveable in two directions;
a plurality of Bowden cables each having an outer tube and a wire therein, each cable being associated with one of the operating units with one end of certain of the wires being connected to the moveable member; and
a pulling mechanism to which the other end of each wire is connected;
each operating unit comprising a frame having one end fixed to said fixed table;
a pair of horizontal, parallel guide rods mounted on said frame;
said moveable member being a mounting member slideably mounted on said guide rods for horizontal movement thereon toward and away from said fixed table;
a vertical cylinder fixed to said mounting member and having an upper end;
a vertical shaft slideably supported in said vertical cylinder for movement upwardly and downwardly;
a first return spring mounted between said frame and said mounting member urging said mounting member away from said fixed table;
a second return spring mounted between said vertical shaft and said vertical cylinder urging said vertical shaft downwardly;
first adjustable stop means for limiting travel of said mounting member along said guide rods in each direction; and second adjustable stop means for limiting travel of said vertical shaft in said vertical cylinder in each direction one end of one outer tube being connected to the fixed end of said frame, the associated wire being connected to said mounting member for pulling said mounting member towards said fixed table against the urging of said first return spring; and one end of another outer tube being connected to said upper end of said vertical cylinder, the associated wire being connected to said vertical shaft for pulling said vertical shaft upwardly against the urging of said second return spring;

said pulling mechanism comprising:

at least two side frames;

a vertical plate attached to said at least two side frames;

a rotatable shaft mounted on said at least two side frames, said rotatable shaft being driven by said means for rotating said turntable;

a plurality of cams fixed to said rotatable shaft;

a plurality of pairs of arms pivotly mounted between said at least two side frames adjacent said cams;

a plurality of cam followers each attached to one pair of arms and interacting with one of said cam;

a plurality of horizontal rods each extending between one pair of arms and each having a plurality of holes therethrough; and a plurality of means for holding a wire mounted on each horizontal rod; each other end of said outer tubes being connected with said vertical plate with the associated wire being held in one of said plurality of means for holding a wire whereby upon rotation of said rotatable shaft, all of said wires held on any one horizontal rod moving in a substantially synchronized relation;

each means for holding comprising a cylindrical holder slideably mounted in one of said holes in one of said horizontal rod and having a stepped portion on a side of said rod opposite to said vertical plate, means for fixing the wire to the cylindrical holder, and a compressible spring mounted between the rod and the stepped portion urging said cylindrical portion urging said cylindrical holder away from said vertical plate; each compressible spring and return spring associated with a particular cable enabling individual adjustment of timing of operation of component movements of working units having said substantially synchronized relation.

* * * * *